(12) United States Patent  
Nemoto

(10) Patent No.: US 7,505,500 B2  
(45) Date of Patent: Mar. 17, 2009

(54) LASER DIODE AND METHOD OF MANUFACTURING THE SAME

(75) Inventor: Kazuhiko Nemoto, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 11/707,905

(22) Filed: Feb. 20, 2007

(65) Prior Publication Data

US 2007/0195845 A1      Aug. 23, 2007

(30) Foreign Application Priority Data

Feb. 22, 2006    (JP)  ............................. 2006-045312

(51) Int. Cl.
  *H01S 5/20*   (2006.01)
  *H01S 5/00*   (2006.01)
(52) U.S. Cl. .................. 372/49.01; 372/45.01
(58) Field of Classification Search ............... 372/43.01, 372/45.01, 49.01, 50.1, 92
See application file for complete search history.

(56) References Cited

U.S. PATENT DOCUMENTS 5,144,634 A * 9/1992 Gasser et al. ............ 372/49.01  
6,628,689 B2 * 9/2003 Okada et al. ............. 372/49.01

FOREIGN PATENT DOCUMENTS

JP    2000-082863    3/2000  
JP    2000-164978    6/2000

* cited by examiner

*Primary Examiner*—Armando Rodriguez  
(74) *Attorney, Agent, or Firm*—Rader Fishman & Grauer PLLC; Ronald P. Kananen

(57) ABSTRACT

A laser diode capable of improving surge withstand voltage by preventing damage to a rear end surface, and a method of manufacturing the same are provided. A laser diode includes a laser resonator between a first end surface as a main emission end surface and a second end surface facing the first end surface, and the laser diode includes a light absorption inhibition region on the second end surface side of the laser resonator.

10 Claims, 7 Drawing Sheets

LASER DIODE AND METHOD OF MANUFACTURING THE SAME

CROSS REFERENCES TO RELATED APPLICATIONS

The present invention contains subject matter related to Japanese Patent Application JP 2006-045312 filed in the Japanese Patent Office on Feb. 22, 2006, the entire contents of which are incorporated herein by reference.

BACKGROUND OF THE INVENTION

1. Field of the Invention

The present invention relates to a laser diode suitable in the case where a very low operating current is desired and a method of manufacturing the same.

2. Description of the Related Art

In a laser diode, in the case where a very low operation current (very low current consumption) is desired, in general, a design focusing on the efficiency of a guided wave in a resonator and featuring very high optical density is adopted. Thereby, while a reduction in the operating current is achieved, a disadvantage such as a large decline in surge withstand voltage becomes apparent, so it is necessary to handle the laser with extra care.

In particular, an InAlGaP-based red laser diode mounted in a portable game console or the like using a DVD (Digital Versatile Disk) as a medium has a structure in which current consumption is reduced to a minimum. Therefore, compared to a typical laser for replaying DVDs, low surge withstand voltage as one characteristic of the laser diode appears prominently. In some cases, the surge withstand voltage is reduced to approximately 10 V.

A decline in the surge withstand voltage depends on the material of a mirror film arranged on an end surface. As widely used materials of the mirror film, an $Al_2O_3$ single layer for a front end surface (a main emission end surface) and an $Al_2O_3$/a-Si multilayer film for a rear end surface are used. However, in the case where $Al_2O_3$/a-Si is used for the rear end surface in a red laser diode, a-Si slightly absorbs red light, so when a surge current or an overcurrent enters, the rear end surface becomes susceptible to damage. This cause's an impediment to the improvement in the surge withstand voltage.

Therefore, to improve the surge withstand voltage, changing the material of the mirror film on the rear end surface can be considered. More specifically, a method of using a material such as $TiO_x$ instead of a-Si can be considered (for example, refer to Japanese Unexamined Patent Application Publication No. 2000-164978).

SUMMARY OF THE INVENTION

However, such an alternative material does not have as high a refractive index as a-Si, so there are the issues that there is the necessity to increase the number of layers of the mirror film, there is difficulty in using the most simple electron beam evaporation system with short tact, and there is the necessity to strictly control a composition ratio to obtain a stable refractive index, and compared to a-Si, it is more difficult to handle the alternative material and its cost tends to be higher. Therefore, the material is not usually used for a laser for replay for which costs need to be reduced.

On the other hand, as a method of reinforcing end surfaces for the purpose of higher output, in related arts, a method of having a so-called window structure in the front and rear end surfaces is widely used (for example, refer to Japanese Unexamined Patent Application Publication No. 2000-82863). However, when the window structure is applied to the laser for replay, a FFP (Far Field Pattern) is reduced, so there is an issue such as the deterioration of replay characteristics or the conditions of application to an optical system.

Moreover, in general, variations in the FFP tend to be wider by the application of the window structure, and specifically in the laser for replay, a radiation angle is relatively large, so variations in the FFP become wider accordingly, and thereby variations in optical coupling become wider.

Further, in a step of forming a laser coupler, for example, by bonding a laser to a photodetection IC (Integrated Circuit) together with a prism, in some cases, the laser emits light at a threshold value or less to recognize the image of a luminous point. At this time, when the window structure is provided to the front end surface, a luminous portion becomes blurred so as to have wider variations, and thereby the recognition accuracy is reduced. Luminous point recognition accuracy is an extremely important parameter in terms of high accuracy mounting. In particular, in a process for achieving very high accuracy mounting by passive alignment, a decline in the luminous point recognition accuracy may be a critical issue.

In view of the foregoing, it is desirable to provide a laser diode capable of improving a surge withstand voltage by preventing damage to a rear end surface and a method of manufacturing the laser diode.

According to an embodiment of the invention, there is provided a laser diode including a laser resonator between a first end surface as a main emission end surface and a second end surface facing the first end surface, the laser diode including a light absorption inhibition region on the second end surface side of the laser resonator.

In the laser diode according to the embodiment of the invention, the light absorption inhibition region is arranged on the second end surface side facing the first end surface where light is emitted, so even in the case where a mirror film on the second end surface is made of a material which absorbs light generated in the laser resonator, the effect of light absorption is mitigated. Therefore, even if a surge current or an overcurrent is applied, damage to the second end surface is prevented, and a surge withstand voltage is improved.

According to an embodiment of the invention, there is provided a method of manufacturing a laser diode, the laser diode including a laser resonator between a first end surface as a main emission end surface and a second end surface facing the first end surface, the method including the steps of forming a semiconductor layer including a plurality of planned laser resonator regions; forming a light absorption inhibition region in the semiconductor layer along a position where the second end surface is planned to be formed; and forming the first end surface and the second end surface so that the light absorption inhibition region is disposed on the second end surface side of the laser resonator.

In the laser diode according to the embodiment of the invention, the light absorption inhibition region is arranged on the second end surface side facing the first end surface as the main emission end surface, so even in the case where a mirror film on the second end surface is made of a material which absorbs light generated in the laser resonator, the effect of light absorption can be mitigated, and damage to the second end surface due to the application of a surge current or an overcurrent can be prevented, and a surge withstand voltage can be improved. In particular, the laser diode is suitably used in the case where a very low operating current and a very low current consumption are strongly desired, for example, as a laser for replaying DVDs or the like mounted in a portable game console.

In the method of manufacturing a laser diode according to the embodiment of the invention, after the light absorption inhibition region is formed in the semiconductor layer, the first end surface and the second end surface are formed so that the light absorption inhibition region is disposed on the second end surface side of the laser resonator, so the light absorption inhibition region can be easily arranged on the second end surface side by adjusting the positions of the first end surface and the second end surface.

Other and further objects, features and advantages of the invention will appear more fully from the following description.

DETAILED DESCRIPTION OF THE PREFERRED EMBODIMENTS

A preferred embodiment will be described in detail below by referring to the accompanying drawings.

Figure 1:
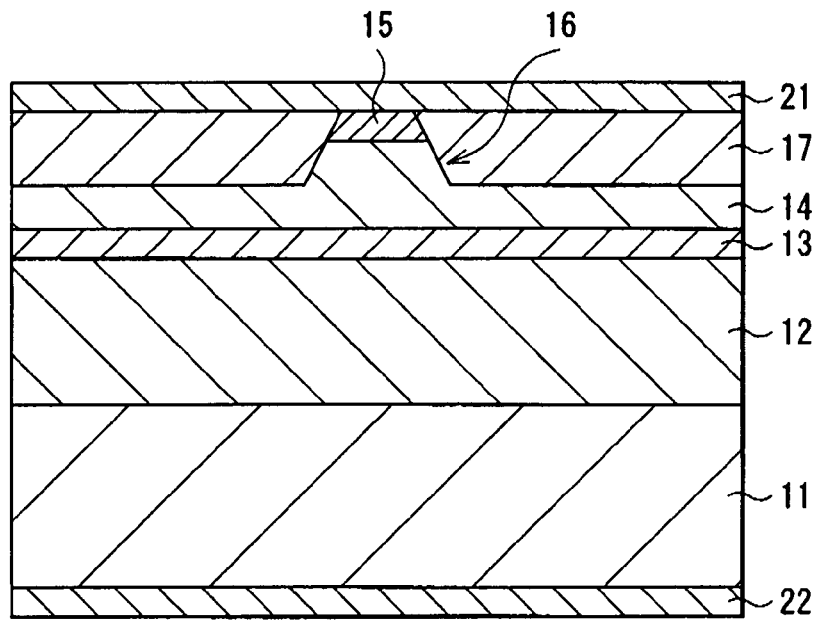
FIG. 1 is a sectional view of a laser diode according to an embodiment of the invention.

FIG. 1 shows an example of a sectional structure of a laser diode according to an embodiment of the invention. The laser diode is used, for example, as a laser for replaying DVDs of a portable game console or the like, and has an oscillation wavelength of approximately 660 nm and an output of approximately 4 mW to 5 mW. The laser diode has a structure in which an n-type cladding layer 12, an active layer 13, a p-type cladding layer 14 and a p-side contact layer 15 are laminated in this order on the substrate 1.

The substrate 1 is made of n-type GaAs doped with silicon as an n-type impurity. The n-type cladding layer 12 is made of, for example, n-type AlGaInP mixed crystal doped with silicon as an n-type impurity. The active layer 13 has a multiquantum well structure including a well layer and a barrier layer which are made of, for example, $Al_xGa_yIn_{1-x-y}P$ ($x \geq 0$ and $y \geq 0$) mixed crystal with different compositions. The p-type cladding layer 14 is made of, for example, p-type AlGaInP mixed crystal doped with zinc as a p-type impurity. The p-side contact layer 15 is made of, for example, p-type GaAs doped with zinc as a p-type impurity. A part of the p-type cladding layer 14 and the p-side contact layer 15 form a thin stripe-shaped portion 16 extending in a resonator direction for current confinement, and a region corresponding to the p-side contact layer 15 of the active layer 13 is a light-emitting region (a current injection region). The width of the stripe-shaped portion 16 is extremely thin, thereby the optical density in the light-emitting region is increased, and the threshold value is reduced to approximately ten-odd mA so that the laser diode is allowed to operate at a very low operating current. Moreover, a current block region 17 is arranged on both sides of the stripe-shaped portion 16.

A p-side electrode 21 is arranged on the p-side contact layer 15. The p-side electrode 21 is formed, for example, by laminating titanium (Ti), platinum (Pt) and gold (Au) on the p-side contact layer 15 in this order, and is electrically connected to the p-side contact layer 15. On the other hand, an n-side electrode 22 is formed on the back surface of the substrate 1. The n-side electrode 22 is formed, for example, by laminating an alloy of gold (Au) and germanium (Ge), nickel (Ni) and gold (Au) on the substrate 1 in order, and then alloying them by heat treatment.

Figure 2:
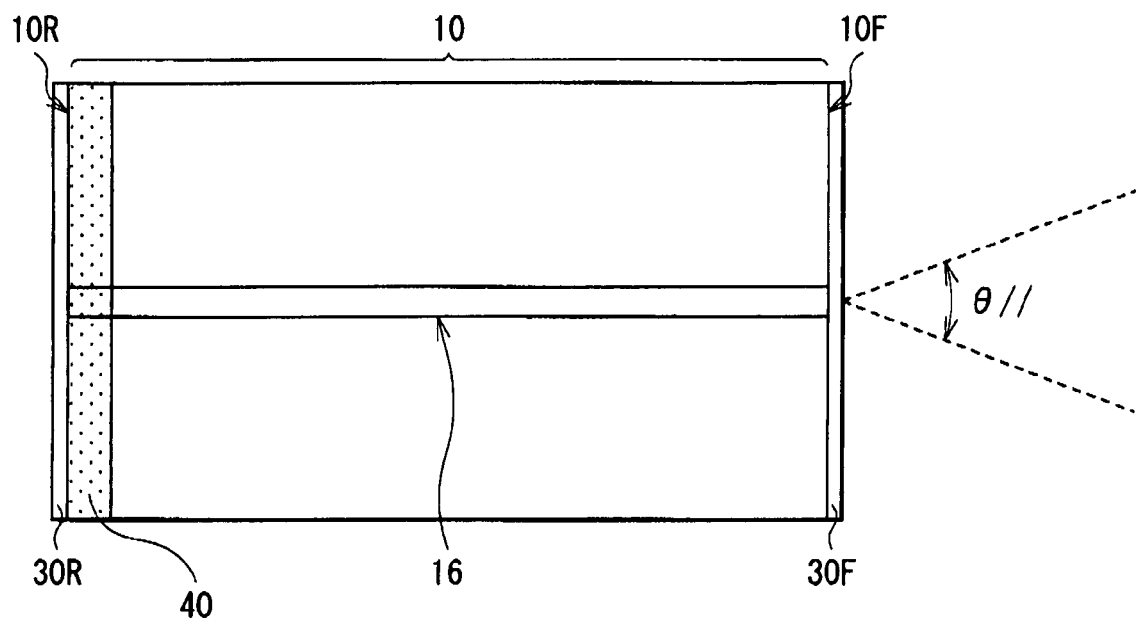
FIG. 2 is a plan view of the laser diode shown in FIG. 1 when viewed from a stripe-shaped portion side.

FIG. 2 shows a plan view of the laser diode when viewed from the stripe-shaped portion 16. The p-side electrode 21 is not shown in FIG. 2. The laser diode has a pair of facing resonator end surfaces in the extending direction of the stripe-shaped portion 16, that is, a first (front) end surface 10F and a second (rear) end surface 10R, and a laser resonator 10 is formed between the first end surface 10F and the second end surface 10R. The first end surface 10F is a so-called main emission end surface, and light generated in the active layer 13 is mainly emitted from the first end surface 10F. On the first end surface 10F, a first mirror film 30F made of, for example, an $Al_2O_3$ single layer is formed. On the other hand, on the second end surface 10R, a second mirror film 30R made of, for example, an $Al_2O_3$/a-Si multilayer film is formed.

Moreover, in the laser diode, a light absorption inhibition region 40 is arranged on the second end surface 10R side of the laser resonator 10. The light absorption inhibition region 40 inhibits light generated in the active layer 13 from being absorbed by a-Si included in the second mirror film 30R, and is preferably an impurity-doped region including an impurity such as boron (B), silicon (Si) or zinc (Zn). Among them, boron (B) is preferable. Thereby, in the laser diode, even in the case where the second mirror film 30R is made of a-Si which absorbs light generated in the active layer 13, damage to the second end surface 10R can be prevented by mitigating the effect of light absorption.

Figure 3:
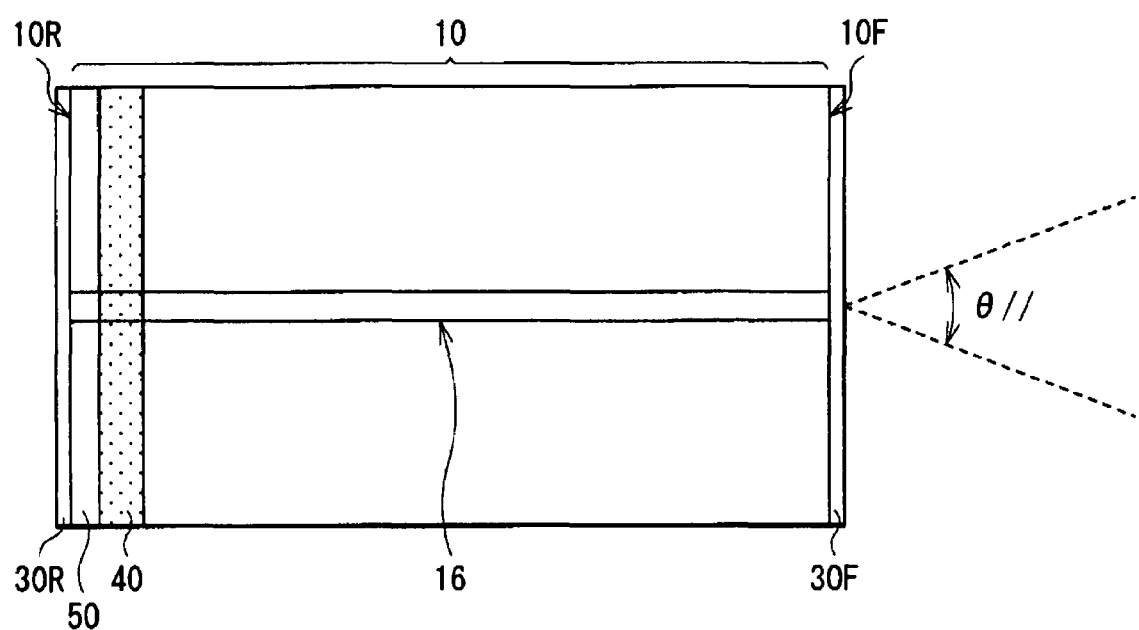
FIG. 3 is a plan view showing a modification of the laser diode shown in FIG. 2.

The end of the light absorption inhibition region 40 does not necessarily match the second end surface 10R, and, for example, as shown in FIG. 3, a gap 50 may be arranged between the second end surface 10R and the light absorption inhibition region 40. As will be described later in the manufacturing steps, in the case where the second end surface 10R is formed by cleavage after forming the light absorption inhibition region 40, it is difficult to form the second end surface 10R so as to match the end of the light absorption inhibition region 40, and the laser diode can be easily manufactured by arranging the gap 50 with an appropriate width between them.

The laser diode can be manufactured by the following steps.

Figure 4:
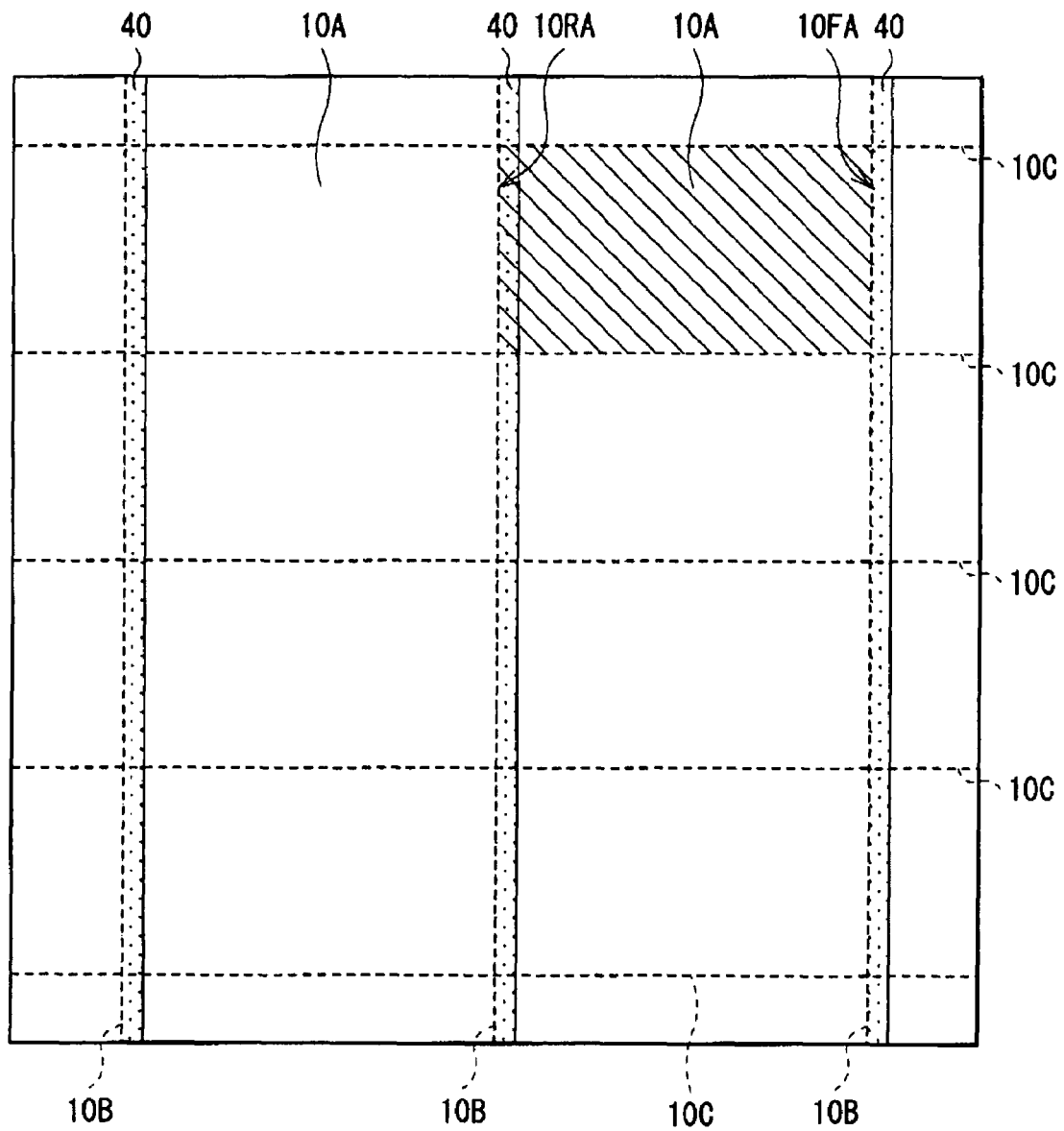
FIG. 4 is a plan view for describing a method of manufacturing the laser diode shown in FIG. 1.

At first, for example, the substrate 1 made of n-type GaAs is prepared, and the n-type cladding layer 12, the active layer 13, the p-type cladding layer 14 and the p-side contact layer 15 made of the above-described materials are grown in order on a surface of the substrate 1 by, for example, a MOCVD (Metal Organic Chemical Vapor Deposition) method. As shown in FIG. 4, a plurality of planned laser resonator regions 10A are included in the substrate 1, the n-type cladding layer 12, the active layer 13, the p-type cladding layer 14 and the p-side contact layer 15 formed in the above manner, and they are separated by a plurality of vertical separation lines 10B and a plurality of horizontal separation lines 10C. Referring to FIG. 4, the vertical separation lines 10B and horizontal separation lines 10C are shown by dotted lines, one planned laser resonator region 10A is diagonally shaded, and a planned first end surface position 10FA and a planned second end surface position 10RA are shown in the diagonally shaded planned laser resonator region 10A.

Next, as shown in FIG. 4, an impurity is diffused or injected from the p-side contact layer 15 so as to form the light absorption inhibition region 40 inside the vertical separation line 10B along with the planned second end surface position 10RA.

More specifically, an insulating film (not shown) made of, for example, $SiO_2$ is formed on the p-side contact layer 15 by, for example, a CVD (Chemical Vapor Deposition) method, and an aperture is formed by photolithography and etching in a position corresponding to a position where the light absorption inhibition region 40 is planned to be formed in the insulating film. Next, for example, boron (B), silicon (Si) or zinc (Zn) as the impurity, preferably boron (B), is diffused into semiconductor crystal via the aperture by impurity diffusion or impurity implantation. Thereby, the impurity reaches the active layer 13, and the active layer 13 is disordered so that the light absorption inhibition region 40 is formed. After that, the insulating film is removed.

Figure 5:
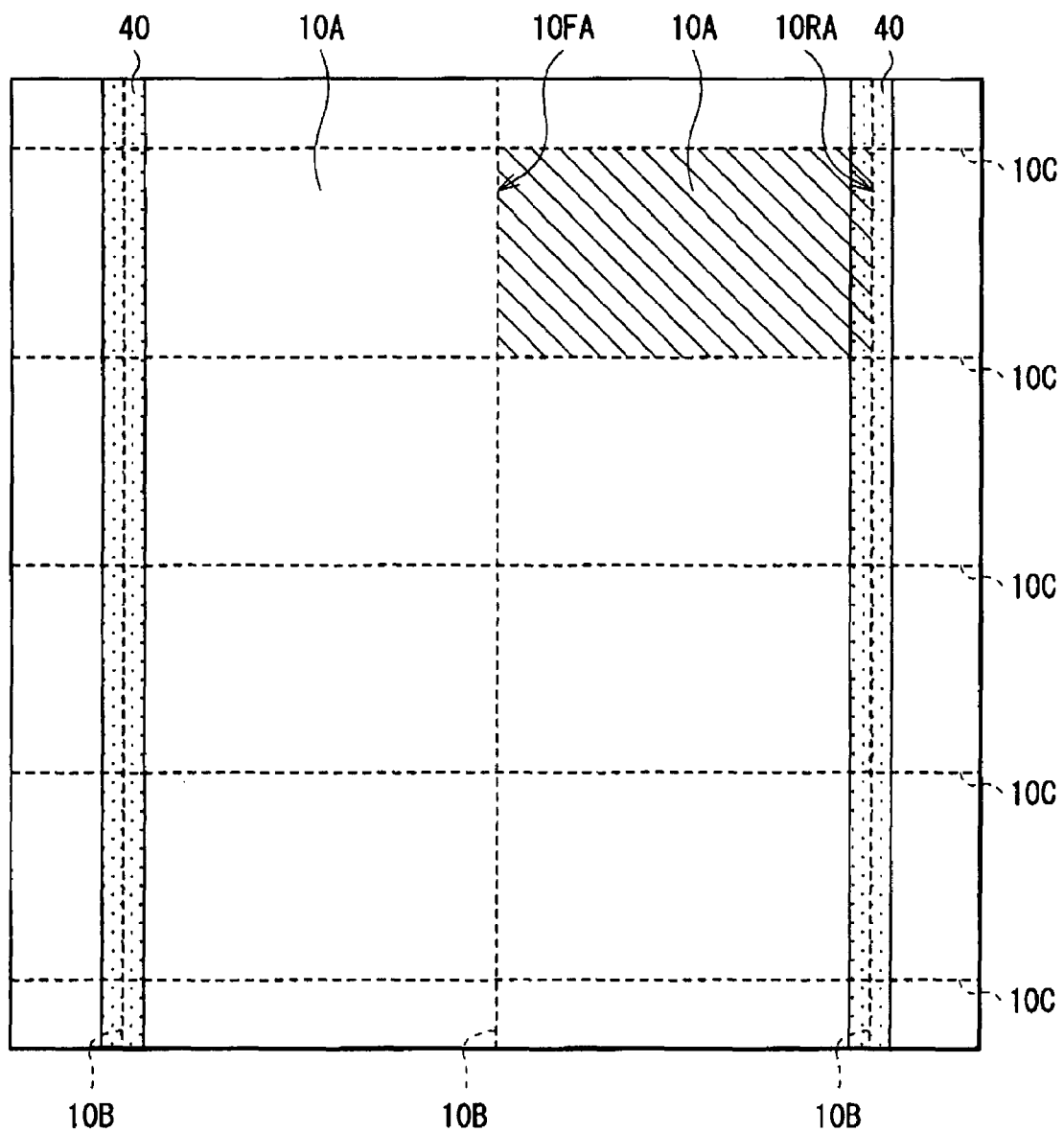
FIG. 5 is a plan view for showing a modification of FIG. 4.

At this time, as shown in FIG. 5, the light absorption inhibition region 40 is formed along every other vertical separation line 10B, and the vertical separation line 10B may be positioned at the center of the light absorption inhibition region 40.

Figure 6:
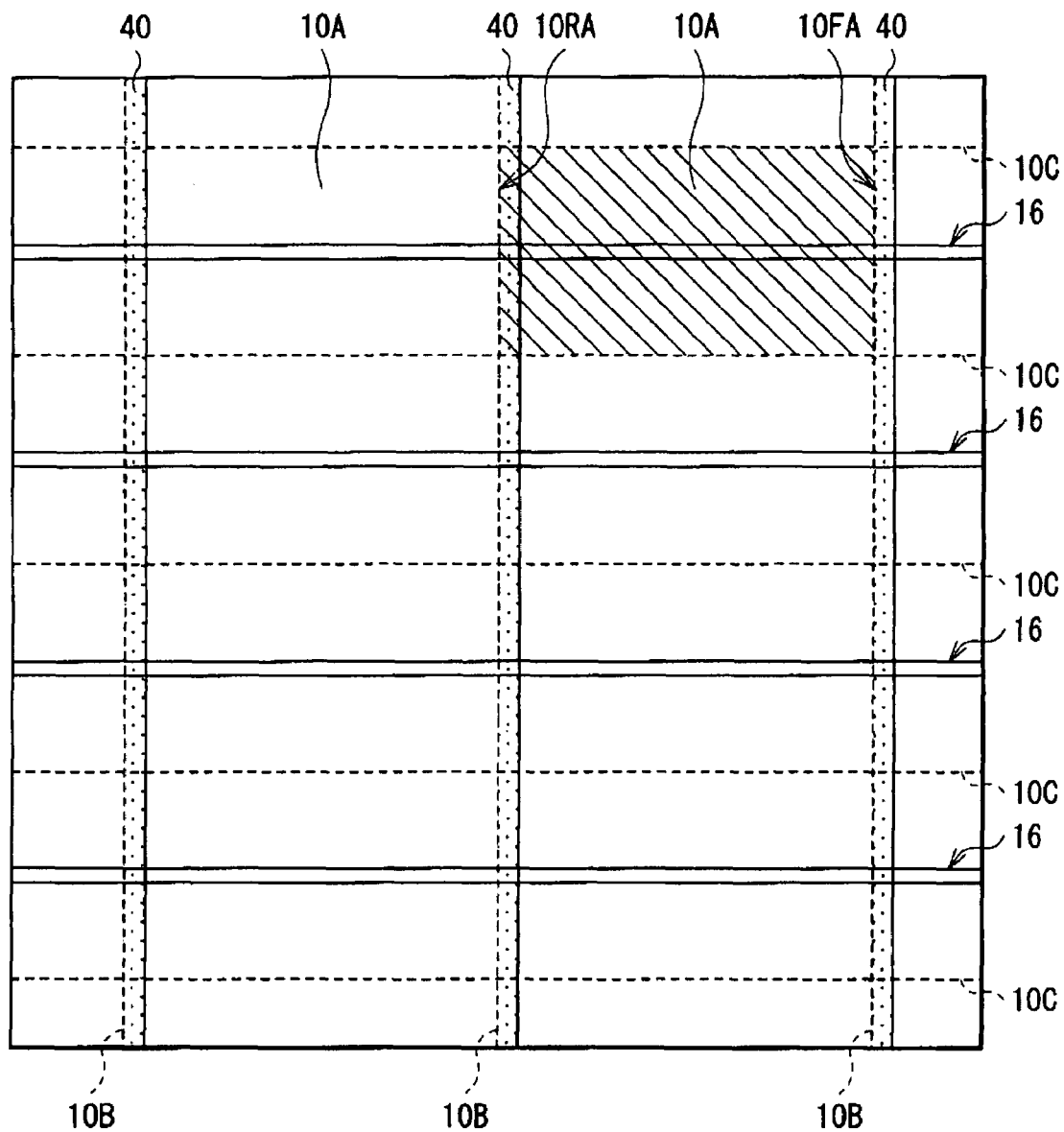
FIG. 6 is a plan view for describing a manufacturing step following a step shown in FIG. 4.

After forming the light absorption inhibition region 40, an insulating film (not shown) made of, for example, $SiO_2$ is formed on the p-side contact layer 15 again by, for example, the CVD method, and the insulating film is subjected to, for example, photolithography and etching to form a mask for forming the stripe-shaped portion 16. Next, a part of the p-side contact layer 15 and a part of the p-type cladding layer 14 are removed by etching using the mask so as to form the stripe-shaped portion 16, as shown in FIG. 6. After that, the current block region 17 is formed on both sides of the stripe-shaped portion 16 by selective epitaxial growth using the mask. After that, the mask is removed.

After forming the stripe-shaped portion 16 and the current block region 17, the p-side electrode 21 made of the above-described material is formed on the p-side contact layer 15, and the n-side electrode 22 made of the above-described material is formed on the back surface of the substrate 1 (refer to FIG. 1).

Figure 7:
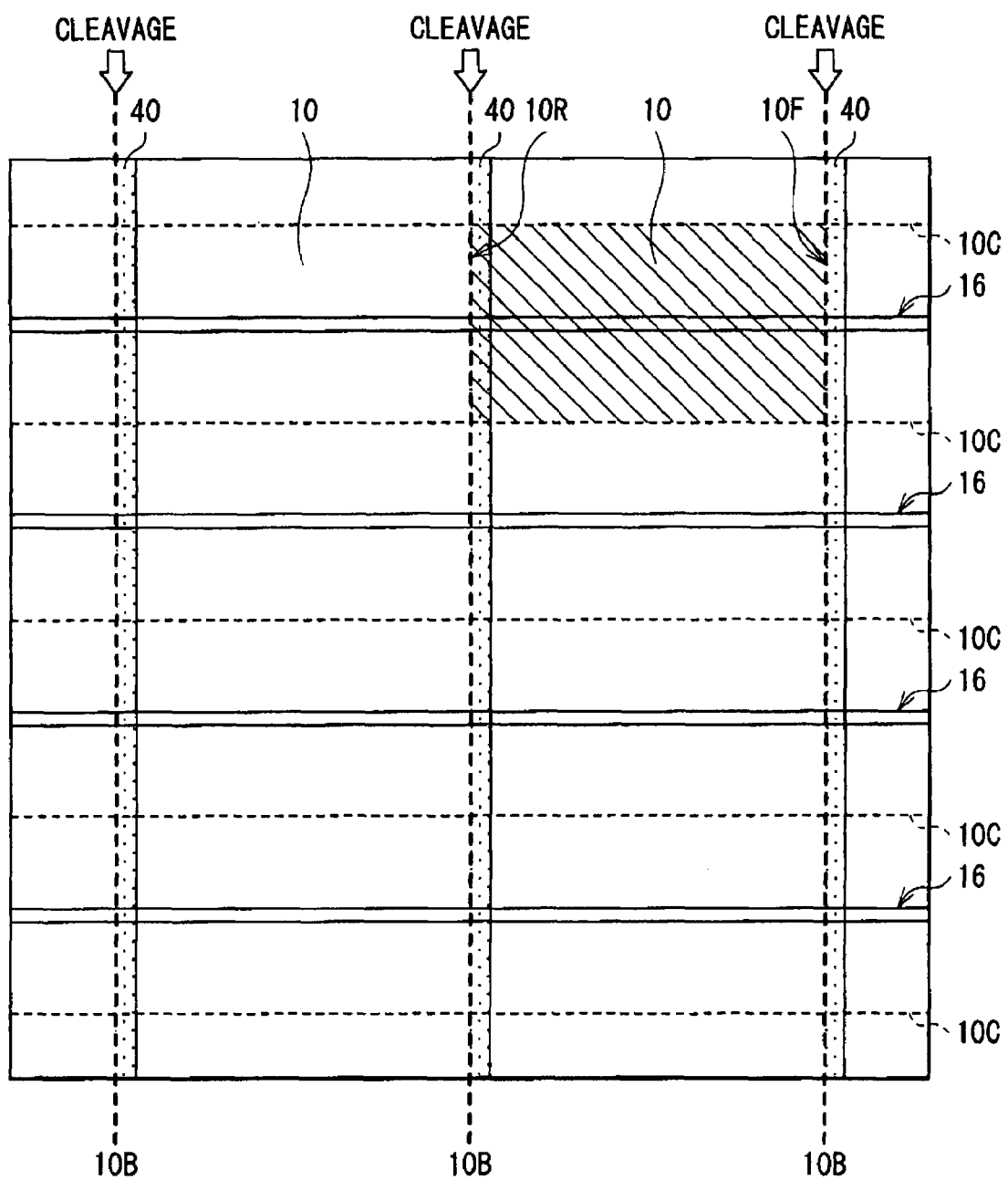
FIG. 7 is a plan view for describing a manufacturing step following the step shown in FIG. 6.
Figure 8:
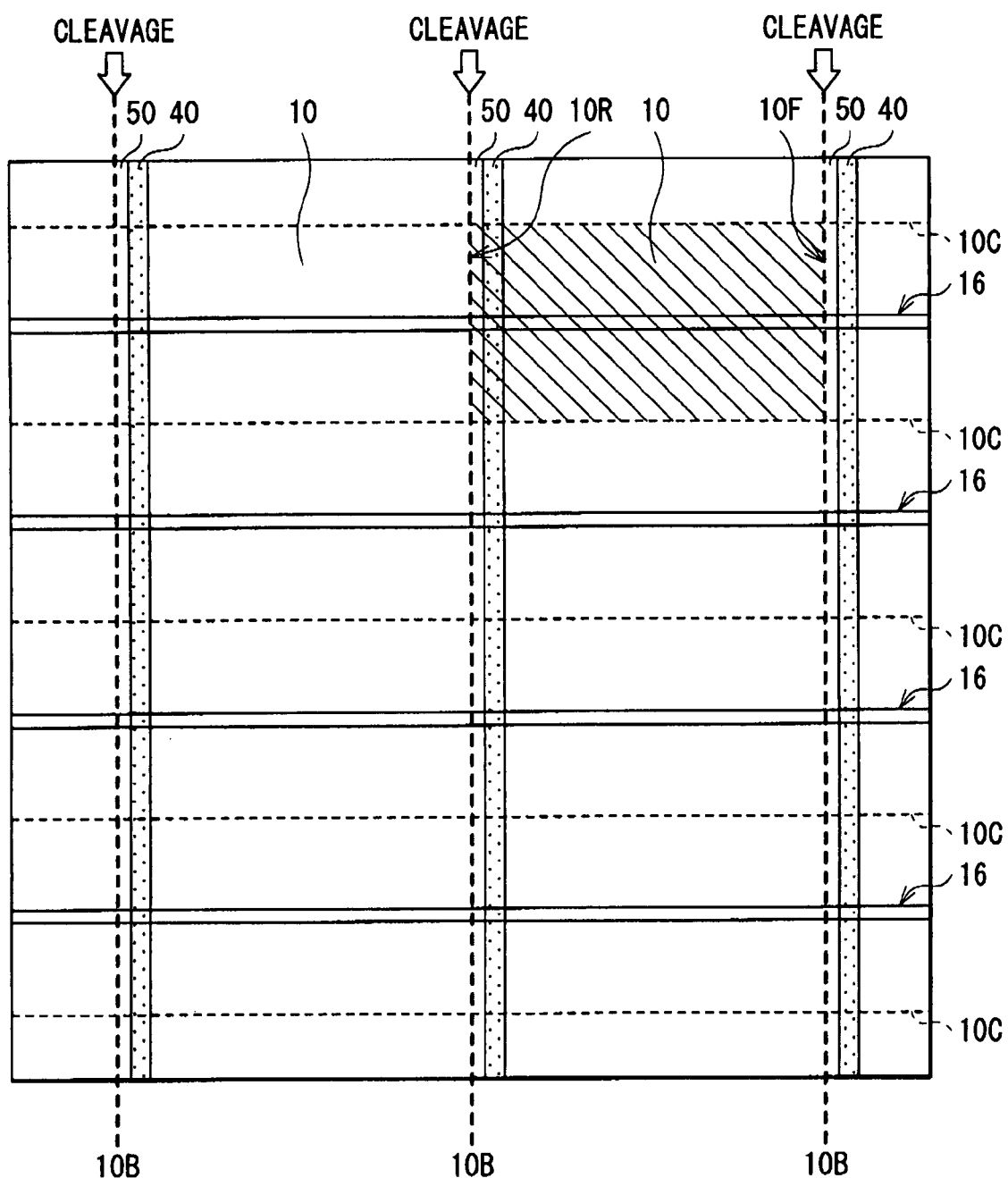
FIG. 8 is a plan view for showing a modification of FIG. 7.

After forming the p-side electrode 21 and the n-side electrode 22, as shown in FIG. 7, the first end surface 10F and the second end surface 10R is formed by, for example, cleavage along the vertical separation lines 10B so that the light absorption inhibition region 40 is disposed on the second end surface 10R side of the laser resonator 10. At this time, as shown in FIG. 8, the gap 50 may be arranged between the second end surface 10R and the light absorption inhibition region 40. After that, the planned laser resonator regions 10A are further separated by the horizontal separation lines 10C to form separate laser resonators 10. Finally, the first mirror film 30F and the second mirror film 30R are formed on the first end surface 10F and the second end surface 10R, respectively. Thus, the laser diode shown in FIGS. 1 and 2 is completed.

In the laser diode, when a voltage is applied between the p-side electrode 21 and the n-side electrode 22, a current is injected into the active layer 13 to cause electron-hole recombination, and thereby light is emitted. The light is reflected from the first mirror film 30F and the second mirror film 30R and travels between them to cause laser oscillation, and the light is emitted from the first end surface 10F to the outside as a laser beam. In this case, the light absorption inhibition region 40 is disposed on the second end surface 10R side opposite to the first end surface 10F where the light is emitted, so even in the case where the second mirror film 30R is made of a-Si which absorbs light generated in the laser resonator 10, the effect of light absorption is mitigated. Therefore, even if a surge current or an overcurrent is applied, damage to the second end surface 10R is prevented, and the surge withstand voltage is improved.

Thus, in the embodiment, the light absorption inhibition region 40 is arranged on the second end surface 10R side opposite to the first end surface 10F where the light is emitted, so even if the second mirror film 30R is made of a-Si which absorbs light generated in the laser resonator 10, the effect of light absorption can be mitigated, damage to the second end surface 10R due to the application of a surge current or an overcurrent can be prevented, and the surge withstand voltage can be improved. In particular, the laser diode according to the embodiment is suitably used in the case where a very low operating current and very low current consumption are strongly desired, for example, as a laser for replaying DVDs or the like mounted in a portable game console.

Moreover, a-Si is a material which is low-cost and easy to handle, so the method according to the embodiment is superior in cost and process stability compared to a method using another material such as $TiO_x$.

Further, the light absorption inhibition region 40 is arranged on a side opposite to the first end surface 10F where light is emitted, so the FFP is not narrowed, a wide radiation angle θ// can be maintained, and high replay characteristics can be obtained specifically in a laser for replay. Variations in the FFP are not increased, and conditions of application to an optical system are advantageous, and when the laser diode according to the embodiment is used in an OP (Optical Pickup), advantages can be obtained in stability in jitter or view characteristics. Further, variations in optical coupling can be reduced, yields can be increased, and stable characteristics can be achieved.

In addition, the recognition accuracy at the time of recognizing the image of a luminous point can be improved, variations in performance in the case where an optical integrated device or a hybrid device is formed with high accuracy mounting can be prevented, and yields can be improved.

Further, in the embodiment, after the light absorption inhibition region 40, the first end surface 10F and the second end surface 10R are formed so that the light absorption inhibition region 40 is disposed on the second end surface 10R side of the laser resonator 10, so the light absorption inhibition region 40 can be easily arranged by adjusting the positions of the first end surface 10F and the second end surface 10R. The position of the light absorption inhibition region 40 can be controlled only by the adjustment of the cutting positions of the first end surface 10F and the second end surface 10R, and a related-art process or wafer design can be used.

Although the present invention is described referring to the embodiment, the invention is not necessarily limited to the embodiment, and it can be variously modified. For example, in the embodiment, the case where an impurity-doped region is formed as the light absorption inhibition region 40 is described; however, the light absorption inhibition region 40 may be formed by removing the active layer 13 and burying the p-type cladding layer 14. Moreover, in the case where the active layer 13 has a quantum well structure, the quantum well thickness of the light absorption inhibition region 40 may be reduced.

Moreover, in the embodiment, the case where after the first end surface 10F and the second end surface 10R are formed, the planned laser resonator regions 10A are further separated by the horizontal separation lines 10C to form separate laser resonators 10 is described; however, the invention is applicable to a laser bar which is not separated by the horizontal separation lines 10C.

Further, the invention is not necessarily limited to the material, the thickness, the forming method and forming conditions and the like of each layer described in the embodiment, and any other material and any other thickness may be used, or any other forming method and any other forming conditions may be used. For example, in the embodiment, the case where each layer made of an AlGaInP-based compound is formed by the MOCVD method is described; however, the layer may be formed by any other vapor deposition method, such as a MBE (Molecular Beam Epitaxy) method or a hydride vapor phase epitaxy method. The hydride vapor phase epitaxy method is a vapor deposition method in which halogen contributes to transport or reaction.

In addition, each layer may be made of any other Group III-V compound semiconductor, including at least indium (In) selected from Group 3B elements in the short form of the periodic table of the elements and at least phosphorus (P) selected from Group 5B elements in the short form of the periodic table of the elements. Further, the invention is applicable to a laser diode made of any other material such as a GaN-based material or a GaAs-based material.

Further, in the embodiment, the laser diode is described referring to a specific structure as an example; however, the invention is applicable to a laser diode with any other structure in the same manner. For example, in the embodiment, a ridge waveguide type laser diode, which is a combination of a gain waveguide type and a refractive index waveguide type, is described as an example; however, the invention is applicable to a gain waveguide type laser diode and a refractive index waveguide type laser diode in the same manner.

In addition, in the embodiment, the structure of the laser diode is described in detail; however, all layers are not necessarily included, and any other layer may be added. For example, a light guide layer may be arranged between the active layer and the n-type cladding layer or the p-type cladding layer.

Further, the invention is not limited to a low-output, low-threshold-value and low-operating-current laser, and it is applicable to a high-output laser or the like.

It should be understood by those skilled in the art that various modifications, combinations, subcombinations and alterations may occur depending on design requirements and other factors insofar as they are within the scope of the appended claims or the equivalents thereof.

What is claimed is:

1. A laser diode comprising:
   a first end surface which is a main emission end surface;
   a second end surface facing the first end surface;
   a laser resonator between the first end surface and the second end surface; and
   a light absorption inhibition region in the second end surface side of the laser resonator.

2. The laser diode according to claim 1, further comprising:
   a gap between the second end surface and the light absorption inhibition region.

3. The laser diode according to claim 1, wherein
   the light absorption inhibition region is an impurity-doped region.

4. The laser diode according to claim 1, further comprising:
   a mirror film on each of the first end surface and the second end surface.

5. The laser diode according to claim 4, wherein
   the mirror film on the second end surface includes a-Si.

6. A method of manufacturing a laser diode, the laser diode including a laser resonator between a first end surface as a main emission end surface and a second end surface facing the first end surface, the method comprising the steps of:
   forming a semiconductor layer including a plurality of planned laser resonator regions;
   forming a light absorption inhibition region in the semiconductor layer along a position where the second end surface is planned to be formed; and
   forming the first end surface and the second end surface so that the light absorption inhibition region is disposed on the second end surface side of the laser resonator.

7. The method of manufacturing a laser diode according to claim 6, wherein
   a gap is arranged between the second end surface and the light absorption inhibition region.

8. The method of manufacturing a laser diode according to claim 6, wherein
   an impurity-doped region is formed as the light absorption inhibition region.

9. The method of manufacturing a laser diode according to claim 6, further comprising the step of:
   forming a mirror film on each of the first end surface and the second end surface.

10. The method of manufacturing a laser diode according to claim 9, wherein the mirror film on the second end surface includes a-Si.

* * * * *